(12) United States Patent
Wang et al.

(10) Patent No.: US 11,108,200 B2
(45) Date of Patent: Aug. 31, 2021

(54) SOCKET CONNECTOR AND CONNECTOR ASSEMBLY

(71) Applicant: Tyco Electronics (Shanghai) Co. Ltd., Shanghai (CN)

(72) Inventors: Chenxi (Josh) Wang, Shanghai (CN); Hongqiang (Sean) Han, Shanghai (CN); Xinbo (Polly) Liu, Shanghai (CN); Clarence Leon Yu, Fremont, CA (US); Ping (Jane) Wei, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/553,716

(22) Filed: Aug. 28, 2019

(65) Prior Publication Data
US 2020/0076141 A1    Mar. 5, 2020

(30) Foreign Application Priority Data
Aug. 28, 2018    (CN) .......................... 201810988921.1

(51) Int. Cl.
| | |
|---|---|
| H01R 13/648 | (2006.01) |
| H01R 25/00 | (2006.01) |
| H01R 13/518 | (2006.01) |
| H01R 13/627 | (2006.01) |
| H01R 12/58 | (2011.01) |
| H05K 1/18 | (2006.01) |
| H01R 13/633 | (2006.01) |

(52) U.S. Cl.
CPC .......... *H01R 25/006* (2013.01); *H01R 12/58* (2013.01); *H01R 13/518* (2013.01); *H01R 13/6275* (2013.01); *H05K 1/184* (2013.01); *H01R 13/6335* (2013.01); *H05K 2201/10189* (2013.01); *H05K 2201/10371* (2013.01); *H05K 2201/10515* (2013.01); *H05K 2201/10537* (2013.01); *H05K 2201/10901* (2013.01)

(58) Field of Classification Search
CPC .. H01R 25/006; H01R 12/58; H01R 13/6275; H01R 13/518; H01R 13/6335; H01R 13/6582; H05K 1/184; H05K 2201/10901; H05K 2201/10537; H05K 2201/10371; H05K 2201/10189; H05K 2201/10515
USPC .......................................................... 439/83
See application file for complete search history.

(56) References Cited

U.S. PATENT DOCUMENTS

| | | | |
|---|---|---|---|
| 7,070,446 B2 | 7/2006 | Henry et al. | |
| 10,153,571 B2* | 12/2018 | Kachlic | ............... H01R 12/712 |
| 2007/0037437 A1* | 2/2007 | Wu | ..................... H01R 13/6335 |
| | | | 439/449 |
| 2010/0029104 A1* | 2/2010 | Patel | .................. H01R 13/6658 |
| | | | 439/76.1 |
| 2011/0195586 A1* | 8/2011 | Wu | ....................... H01R 13/512 |
| | | | 439/152 |
| 2012/0058665 A1* | 3/2012 | Zerebilov | .......... H01R 13/6275 |
| | | | 439/370 |

(Continued)

*Primary Examiner* — Abdullah A Riyami
*Assistant Examiner* — Nelson R. Burgos-Guntin
(74) *Attorney, Agent, or Firm* — Barley Snyder

(57) ABSTRACT

A socket connector includes a housing defining a pair of rows of insertion cavities and an elastic fastener formed on a bottom wall of each insertion cavity. Each row of insertion cavities has at least one insertion cavity. The elastic fastener is adapted to engage a plug connector inserted into the insertion cavity.

15 Claims, 6 Drawing Sheets

(56) References Cited

U.S. PATENT DOCUMENTS

| | | | | |
|---|---|---|---|---|
| 2012/0058670 A1* | 3/2012 | Regnier | ............... | H01R 12/00 |
| | | | | 439/485 |
| 2012/0129382 A1* | 5/2012 | Regnier | ............ | H01R 13/7197 |
| | | | | 439/421 |
| 2012/0190224 A1* | 7/2012 | Wu | ................ | H01R 13/633 |
| | | | | 439/157 |
| 2013/0171885 A1* | 7/2013 | Zhang | ................ | H01R 13/6471 |
| | | | | 439/676 |
| 2013/0231011 A1* | 9/2013 | Sytsma | ........... | H01R 13/65914 |
| | | | | 439/723 |
| 2013/0273766 A1* | 10/2013 | Lindkamp | ........... | H01R 13/516 |
| | | | | 439/345 |
| 2013/0344722 A1* | 12/2013 | Lloyd | ............... | H01R 13/6275 |
| | | | | 439/160 |
| 2014/0038447 A1* | 2/2014 | Brown | .............. | H01R 13/6275 |
| | | | | 439/350 |
| 2015/0180171 A1* | 6/2015 | Okabe | ................ | G02B 6/4261 |
| | | | | 439/342 |
| 2015/0311642 A1* | 10/2015 | Rost | ................ | H01R 9/032 |
| | | | | 439/607.01 |
| 2015/0340796 A1* | 11/2015 | Lu | ................. | H01R 24/60 |
| | | | | 439/352 |
| 2018/0026413 A1* | 1/2018 | Dambach | ............. | H01R 24/60 |
| | | | | 439/638 |
| 2020/0076141 A1* | 3/2020 | Wang | ................ | H05K 1/184 |

* cited by examiner

SOCKET CONNECTOR AND CONNECTOR ASSEMBLY

CROSS-REFERENCE TO RELATED APPLICATION

This application claims the benefit of the filing date under 35 U.S.C. § 119(a)-(d) of Chinese Patent Application No. 201810988921.1, filed on Aug. 28, 2018.

FIELD OF THE INVENTION

The present invention relates to a socket connector and, more particularly, to a socket connector with at least two rows of insertion cavities.

BACKGROUND

A z-Quad Small Form-factor Pluggable Plus (zQSFP+) socket connector is a small pluggable connector that typically comprises a housing, also referred to as a cage, an insulation body received in the housing, and terminals held in the insulation body. In order to improve space utilization, the housing of the conventional socket connector defines two rows or layers of insertion cavities. A plurality of plug connectors engaged with the socket connector may be respectively inserted into the insertion cavities.

An elastic fastener is formed on a top wall of a lower insertion cavity of the socket connector, and a groove engaged with the elastic fastener is formed on a bottom surface of the plug connector. When the plug connector is inserted into the lower insertion cavity of the socket connector, the elastic fastener on the socket connector is engaged into the groove of the plug connector, thereby holding the plug connector in the insertion cavity of the socket connector.

The plug connector comprises a pull strip connected to a top surface thereof, and the plug connector may be pulled out of the insertion cavity of the socket connector by pulling the pull strip. However, when two socket connectors are mounted on the front and back sides of the circuit board in a symmetrical manner, two pull strips of two plug connectors inserted into two adjacent insertion cavities of the two socket connectors in one column may face each other and abut against each other. The pull strips of the two plug connectors spatially interfere with each other and occupy a space for manually operating the plug connectors, and it is therefore difficult to pull the plug connectors out by pulling the pull strips.

SUMMARY

A socket connector includes a housing defining a pair of rows of insertion cavities and an elastic fastener formed on a bottom wall of each insertion cavity. Each row of insertion cavities has at least one insertion cavity. The elastic fastener is adapted to engage a plug connector inserted into the insertion cavity.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
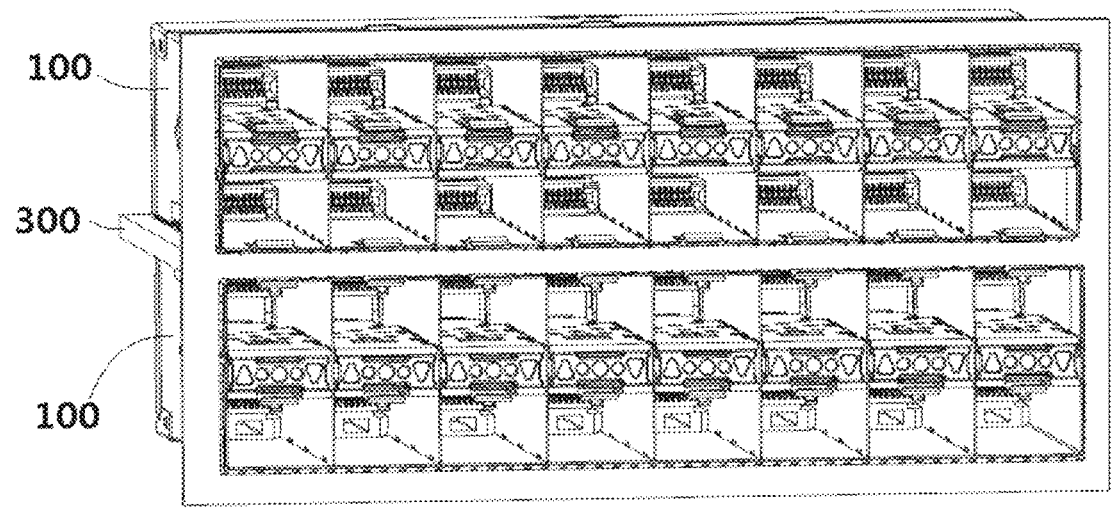
FIG. 1 is a perspective view of a connector assembly according to an embodiment.

Technical solutions of the present disclosure will be described hereinafter in detail with reference to these embodiments in conjunction with the accompanying drawings, wherein the same or similar reference numerals refer to the same or similar elements. The following description of the embodiments of the present disclosure with reference to the accompanying drawings is intended to illustrate the general inventive concept of the invention, and should not be construed as limiting the invention.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A connector assembly according to an embodiment, as shown in FIG. 1, includes a circuit board 300 and a pair of socket connectors 100. The socket connectors 100 are symmetrically mounted on the front and back sides of the circuit board 300.

Each socket connector 100, as shown in FIGS. 2A-4, comprises a housing 110. In an embodiment, the housing 110 is a metal housing, for example, a cage made of iron sheets. The housing 110 defines at least two rows of insertion cavities 101, each row of insertion cavities 101 including at least one insertion cavity 101. In the shown embodiments, each row of insertion cavities 101 comprises a plurality of insertion cavities 101 arranged in a horizontal direction. In the shown embodiments, the housing 110 defines two rows of insertion cavities 101; lower insertion cavities 101 arranged at a lower row and upper insertion cavities 101 arranged at an upper row. Each row of insertion cavities 101 comprises eight insertion cavities 101, which are arranged in a horizontal direction. An elastic fastener 111 is formed on a bottom wall 112 of each of the insertion cavities 101.

Figure 2A:
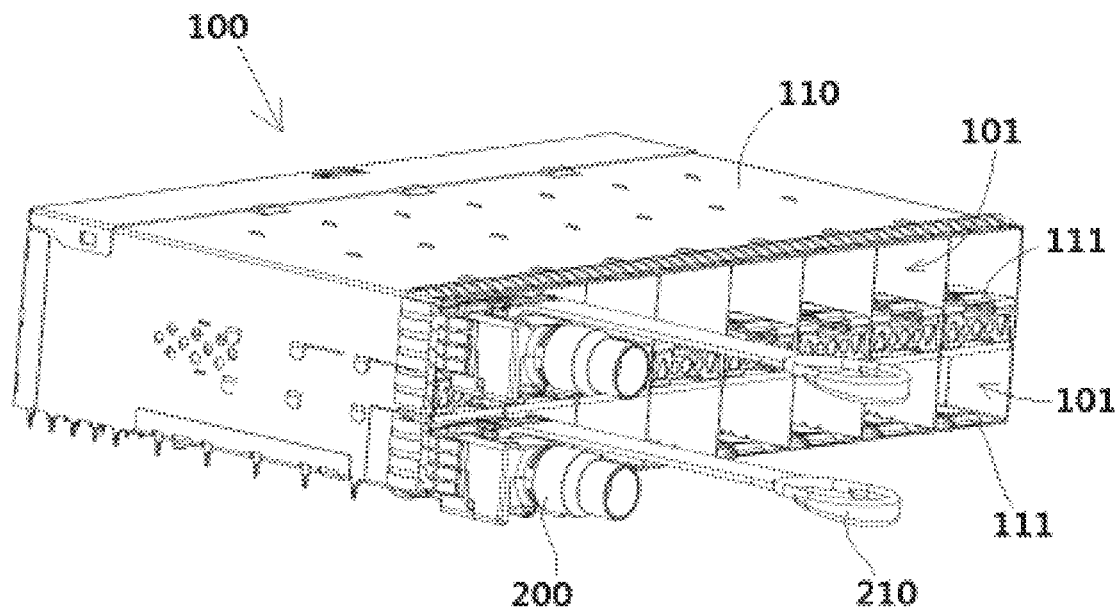
FIG. 2A is a top perspective view of a socket connector of the connector assembly.
Figure 2B:
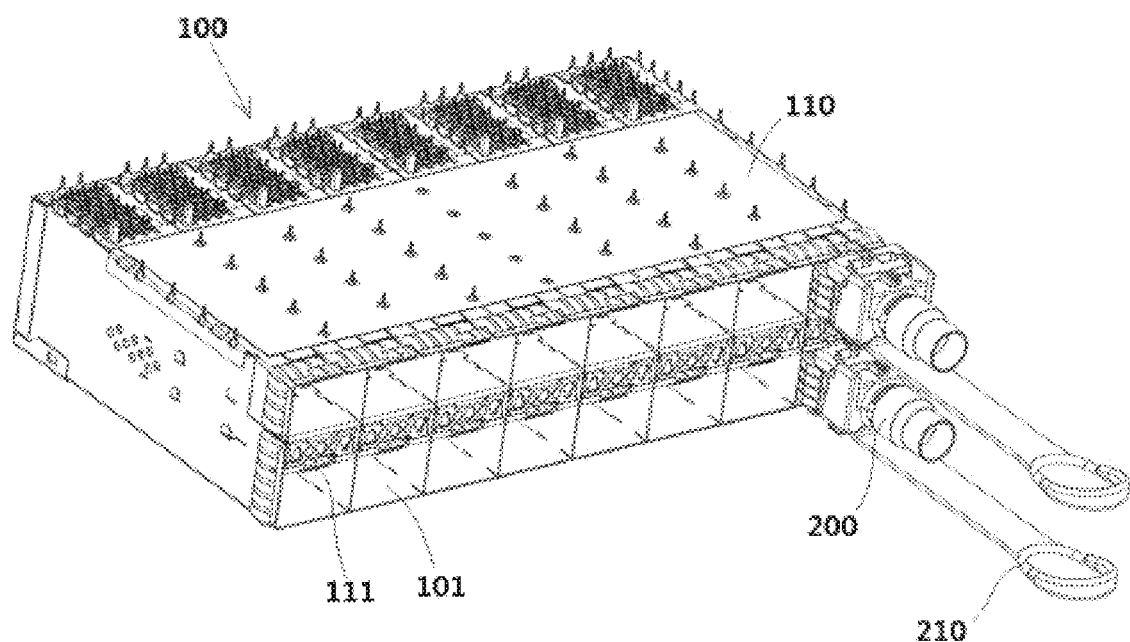
FIG. 2B is a bottom perspective view of the socket connector.

As shown in FIGS. 2A and 2B, the connector assembly comprises a plurality of plug connectors 200 adapted to be inserted into the insertion cavities 101 of the socket connector 100. Each plug connector 200 has a pull strip 210 connected to a top surface thereof. The plug connector 200 may be pulled out of the insertion cavity 101 of the socket connector 100 by pulling the pull strip 210.

Figure 3:
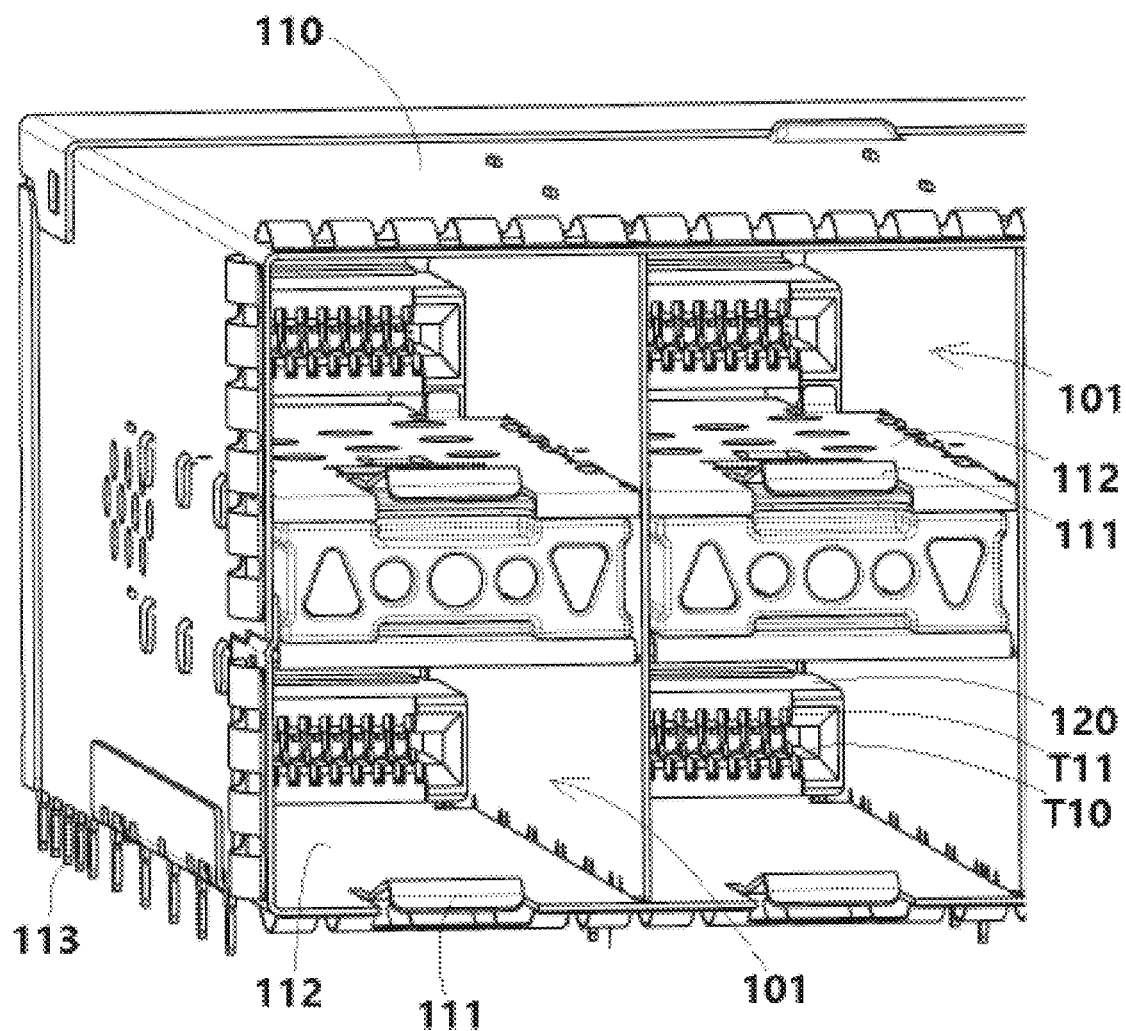
FIG. 3 is a perspective view of a portion of the socket connector.

The elastic fastener 111, shown in FIGS. 2A-3, is adapted to be engaged into a plug connector 200 inserted into the insertion cavity 101. A groove is formed on a bottom surface of the plug connector 200, and the elastic fastener 111 is adapted to be snapped into the groove on the bottom surface of the plug connector 200. The elastic fastener 111 is adapted to be engaged into a bottom surface of the plug connector 200. When the plug connector 200 is inserted into the insertion cavity 101, the elastic fastener 111 on the bottom wall of the insertion cavity 101 is engaged into the groove in the bottom surface of the plug connector 200, and the pull strip 210 on the top surface of the plug connector 200 is located at the top wall of the insertion cavity 101 and extends outwardly from a port of the insertion cavity 101.

As shown in FIGS. 1, 2A, and 2B, when the two socket connectors 100 are mounted on the front and the back sides of the circuit board 300, the pull strips 210 of the plug connectors 200 inserted into two adjacent insertion cavities 101 of the two socket connectors 100 are arranged in one column; in a upper and lower direction or a height direction as shown in FIGS. 2A and 2B. The pull strips 210 are arranged away from and separated from each other, and will not interfere with each other in space, so that the plug connector 200 may be conveniently pulled out by pulling the pull strip 210 by hand.

Figure 4:
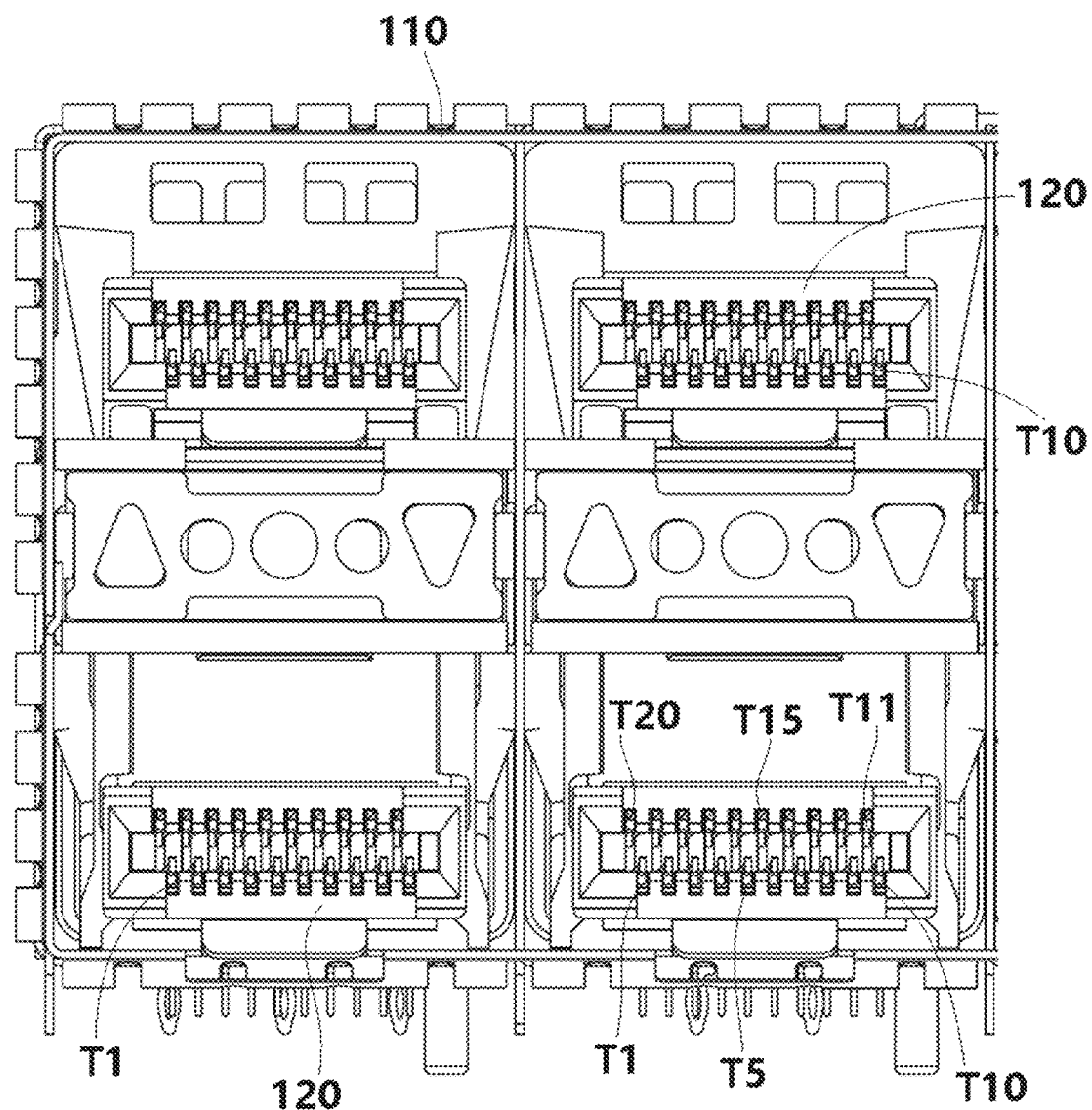
FIG. 4 is a front view of the portion of the socket connector.

As shown in FIG. 4, an insulation body 120 is provided in each of the insertion cavities 101, and at least one row of terminals T1-T10, T11-T20 are provided on the insulation body 120. Each of the terminals T1-T20 has a connection pin exposed from a bottom surface of the housing 110 and adapted to be electrically connected to the circuit board 300. The connection pins of the terminals T1-T20 have a pin-shape, and the pin-shaped connection pins are adapted to be inserted into receptacles in the circuit board 300. In other embodiments, the connection pins of the terminals T1-T20 may be flat for soldering to solder pads on the circuit board 300.

Figure 5:
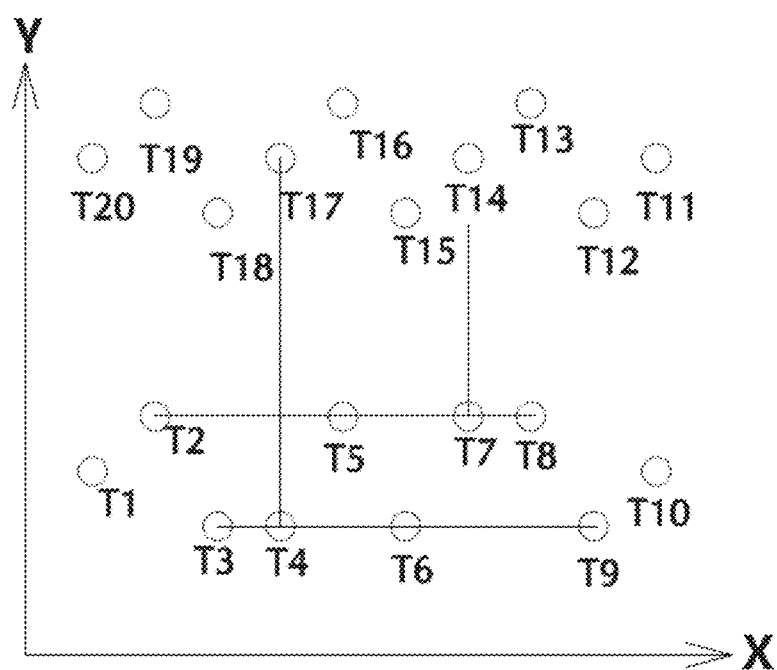
FIG. 5 is a schematic diagram of a plurality of connection pins of terminals of the socket connector.

Two sets of terminals T1-T10, T11-T20 are provided on each of the insulation bodies 120, and the connection pins of each of the two sets of terminals T1-T10, T11-T20 are arranged in a plurality of rows and a plurality of columns as shown in FIG. 5. In the shown embodiment each set of terminals T1-T10, T11-T20 comprises the same number of terminals. Each row of the connection pins of the terminals T1-T20 are aligned and arranged in one row in the first direction X, and each column of the connection pins of the terminals T1-T20 are aligned and arranged in one column in the second direction Y perpendicular to the first direction X.

As shown in FIGS. 3-5, the lower set of terminals T1-T10 of the two sets of terminals T1-T10, T11-T20 are sequentially arranged from the left side to the right side, and are represented by T1, T2, . . . , T10, respectively. The upper set of terminals T11-T20 of the two sets of terminals T1-T10, T11-T20 are sequentially arranged from the right side to the left side, and are represented by T11, T12, . . . , T20, respectively.

In the shown embodiment, one set of terminals T1-T10 of the sets of terminals T1-T10, T11-T20 comprises a plurality of low-speed signal terminals T4, T7, and the connection pins of any two of the plurality of low-speed signal terminals T4, T7 are not arranged in the same row or in the same column as shown in FIG. 5. Thus, the low-speed signal terminals T4 and T7 are staggered with each other in a row direction or in a column direction to avoid mutual interference. In the shown embodiment, the connection pins of any two of the plurality of low-speed signal terminals T4, T7 are also not arranged in adjacent rows or adjacent columns. Thus, the low-speed signal terminals T4 and T7 may be staggered by a large distance, and mutual interference is further avoided. In the shown embodiment each set of terminals T1-T10, T11-T20 comprises ten terminals, and one set of terminals T1-T10 of the two set of terminals T1-T10, T11-T20 comprises two low-speed signal terminals T4, T7.

A plurality of plug pins 113 are formed at the bottom of the housing 110 of each of the socket connectors 100, as shown in FIG. 3. The plug pins 113 are adapted to be inserted into a receptacle in the circuit board 300 to secure the socket connector 100 to the circuit board 300.

It should be appreciated by those skilled in this art that the above embodiments are intended to be illustrative, and many modifications may be made to the above embodiments by those skilled in this art, and various structures described in various embodiments may be freely combined with each other without conflicting in configuration or principle.

Although the present disclosure have been described hereinbefore in detail with reference to the attached drawings, it should be appreciated that the disclosed embodiments in the attached drawings are intended to illustrate the embodiments of the present disclosure by way of example, and should not be construed as limitation to the present disclosure.

Although several exemplary embodiments have been shown and described, it would be appreciated by those skilled in the art that various changes or modifications may be made to these embodiments without departing from the principles and spirit of the disclosure, the scope of which is defined by the claims and their equivalents.

What is claimed is:

1. A socket connector, comprising:
    a housing defining a pair of rows of insertion cavities, each row of insertion cavities having an insertion cavity; and
    an elastic fastener formed on a bottom wall of each insertion cavity and adapted to engage a plug connector inserted into the insertion cavity, the elastic fastener engages a bottom surface of the plug connector, the bottom surface of the plug connector has a groove and the elastic fastener snaps into the groove to secure the plug connector in the insertion cavity.

2. The socket connector of claim 1, wherein the plug connector has a pull strip connected to a top surface of the plug connector.

3. The socket connector of claim 1, further comprising an insulation body disposed in each insertion cavity.

4. The socket connector of claim 3, wherein a set of terminals is disposed on the insulation body, each terminal of the set of terminals has a connection pin exposed out of a bottom surface of the housing and adapted to be electrically connected to a circuit board.

5. The socket connector of claim 4, wherein the connection pin is adapted to be inserted into a receptacle in the circuit board.

6. The socket connector of claim 4, wherein a pair of sets of terminals are disposed on each insulation body, the connection pins of the terminals of each of the sets of terminals are arranged in a plurality of rows and a plurality of columns.

7. The socket connector of claim 6, wherein one of the pair of sets of terminals has a plurality of low-speed signal terminals, the connection pins of any two of the plurality of low-speed signal terminals are not arranged in a same row or in a same column.

8. The socket connector of claim 7, wherein the connection pins of any two of the plurality of low-speed signal terminals are not arranged in adjacent rows or adjacent columns.

9. The socket connector of claim 8, wherein each set of terminals has a same number of terminals.

10. The socket connector of claim 9, wherein each of the pair of sets of terminals has ten terminals and the one of the pair of sets of terminals has two low-speed signal terminals.

11. A connector assembly, comprising:
a circuit board; and
a pair of socket connectors symmetrically mounted on a front side and a back side of the circuit board, each of the socket connectors including a housing defining a pair of rows of insertion cavities, each row of insertion cavities having an insertion cavity, and an elastic fastener formed on a bottom wall of each insertion cavity and adapted to engage a plug connector inserted into the insertion cavity, the elastic fastener engages a bottom surface of the plug connector, the bottom surface of the plug connector has a groove and the elastic fastener snaps into the groove to secure the plug connector in the insertion cavity.

12. The connector assembly of claim 11, wherein the housing has a plurality of plug pins at a bottom of the housing, the plug pins are adapted to be inserted into a plurality of receptacles in the circuit board.

13. The connector assembly of claim 11, wherein the circuit board has a plurality of solder pads or receptacles, each of the socket connectors has a set of terminals, each terminal of the set of terminals has a connection pin adapted to be soldered to the solder pads or inserted into the receptacles.

14. The connector assembly of claim 11, further comprising a plurality of plug connectors adapted to be inserted into the insertion cavities.

15. The connector assembly of claim 14, wherein each of the plug connectors has a pull strip connected to a top surface of the plug connector, the plug connector is adapted to be pulled out of the insertion cavity by pulling the pull strip.

\* \* \* \* \*